United States Patent
Choi et al.

(10) Patent No.: US 11,061,608 B2
(45) Date of Patent: Jul. 13, 2021

(54) MEMORY CONTROLLER AND MEMORY SYSTEM HAVING THE SAME

(71) Applicant: SK hynix Inc., Gyeonggi-do (KR)

(72) Inventors: Young Guen Choi, Gyeonggi-do (KR); Dong Ham Yim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 50 days.

(21) Appl. No.: 16/198,269

(22) Filed: Nov. 21, 2018

(65) Prior Publication Data

US 2019/0324689 A1   Oct. 24, 2019

(30) Foreign Application Priority Data

Apr. 23, 2018  (KR) .......................... 10-2018-0046823

(51) Int. Cl.
*G06F 3/06* (2006.01)
*G11C 7/10* (2006.01)
*G06F 12/1009* (2016.01)

(52) U.S. Cl.
CPC .......... *G06F 3/0659* (2013.01); *G06F 3/0604* (2013.01); *G06F 3/064* (2013.01); *G06F 3/0653* (2013.01); *G06F 3/0656* (2013.01); *G06F 3/0673* (2013.01); *G06F 12/1009* (2013.01); *G11C 7/1084* (2013.01); *G06F 2212/1032* (2013.01); *G06F 2212/1044* (2013.01); *G06F 2212/657* (2013.01)

(58) Field of Classification Search
CPC .... G06F 3/0659; G06F 3/0673; G06F 3/0656; G06F 3/0653; G06F 3/064; G06F 3/0604; G06F 12/1009; G06F 2212/1032; G06F 2212/1044; G06F 2212/657; G11C 7/1084

See application file for complete search history.

(56) References Cited

U.S. PATENT DOCUMENTS

| | | | |
|---|---|---|---|
| 2011/0022778 A1* | 1/2011 | Schibilla | G06F 12/0246 711/103 |
| 2011/0055458 A1* | 3/2011 | Kuehne | G06F 12/0246 711/103 |
| 2013/0061101 A1* | 3/2013 | Fitzpatrick | G11C 16/349 714/718 |
| 2015/0332788 A1* | 11/2015 | Bellorado | G11C 11/5642 714/719 |
| 2016/0246530 A1* | 8/2016 | Mylavarapu | G06F 3/0625 |
| 2016/0342458 A1* | 11/2016 | Cai | G11C 16/26 |

(Continued)

FOREIGN PATENT DOCUMENTS

| | | |
|---|---|---|
| KR | 101577721 | 12/2015 |
| KR | 1020160015062 | 2/2016 |

(Continued)

*Primary Examiner* — Ramon A. Mercado
(74) *Attorney, Agent, or Firm* — IP & T Group LLP

(57) ABSTRACT

A memory system includes a memory controller. The memory controller includes: a buffer memory configured to store read count values of memory blocks and address mapping information of the memory blocks; and a central processing unit configured to monitor the read count values, and determine whether a refresh operation of target blocks, among the memory blocks, is to be performed on all memory blocks including target blocks in a super block, in a unit of the super block or on the target memory blocks in the super block in a unit of a single block, based on the monitoring result.

20 Claims, 13 Drawing Sheets

(56) References Cited

U.S. PATENT DOCUMENTS

| | | | | |
|---|---|---|---|---|
| 2017/0286288 A1* | 10/2017 | Higgins | ............... | G06F 3/0652 |
| 2018/0024777 A1* | 1/2018 | Higgins | ............ | G11C 16/3422 |
| | | | | 711/103 |
| 2018/0374549 A1* | 12/2018 | Padilla | ............... | G11C 16/3427 |
| 2019/0065394 A1* | 2/2019 | Lee | .................... | G06F 12/0246 |
| 2019/0324689 A1* | 10/2019 | Choi | ................... | G11C 7/1084 |

FOREIGN PATENT DOCUMENTS

| KR | 1020160139864 | 12/2016 |
|---|---|---|
| KR | 1020170104111 | 9/2017 |

* cited by examiner

FIG. 13

MEMORY CONTROLLER AND MEMORY SYSTEM HAVING THE SAME

CROSS-REFERENCE TO RELATED APPLICATION

The present application claims priority under 35 U.S.C. § 119(a) to Korean patent application number 10-2018-0046823, filed on Apr. 23, 2018, which is incorporated herein by reference in its entirety.

BACKGROUND

Field of Invention

The present disclosure generally relates to a memory controller and a memory system having the same, and more particularly, to a memory controller capable of performing a refresh operation and a memory system having such a memory controller.

Description of Related Art

A memory system may include a storage device and a memory controller.

The storage device may include a plurality of memory devices, which store data or output stored data. The memory devices may be volatile memory devices in which stored data is lost when the supply of power is interrupted, or nonvolatile memory devices in which stored data is retained even when the supply of power is interrupted.

The memory controller may control data communication between a host and the storage data.

The host may communicate with the storage device through the memory controller by using an interface protocol such as Peripheral Component Interconnect-Express (PCI-e or PCIe), Advanced Technology Attachment (ATA), Serial ATA (SATA), Parallel ATA (DATA), or Serial Attached SCSI (SAS). Other interface protocols that may be used for communication between the host and the memory system include a Universal Serial Bus (USB), a Multi-Media Card (MMC), an Enhanced Small Disk Interface (ESDI), and Integrated Drive Electronics (IDE).

SUMMARY

Embodiments provide a memory controller capable of performing a refresh operation in units of super blocks or single blocks according to the number of refresh target blocks, and a memory system including the memory controller.

In accordance with an aspect of the present disclosure, there is provided a memory controller including: a buffer memory configured to store read count values of memory blocks and address mapping information of the memory blocks; and a central processing unit configured to monitor the read count values, and determine whether a refresh operation of target blocks, among the memory blocks, is to be performed on all memory blocks including target blocks in a super block, in a unit of the super block or on the target memory blocks in the super block in a unit of a single block, based on the monitoring result.

In accordance with another aspect of the present disclosure, there is provided a memory system including: a plurality of memory devices including a plurality of memory blocks; and a memory controller configured to, when a refresh operation is performed on the memory blocks in the memory devices, control the memory devices to perform the refresh operation on the memory blocks on all memory blocks in a super block, in a unit of super block or on an individual block basis, in a unit of a single block, according to a number of memory blocks on which the refresh operation is to be performed.

In accordance with another aspect of the present disclosure, there is provided a memory system including: a memory device including first and second super blocks, each including memory blocks; and a memory controller suitable for: determining target memory blocks to perform a refresh operation based on a read count value for each of the memory blocks in the first super block; copying data of all of the memory blocks in the first super block to the second super block, when the number of the target memory blocks is greater than a set number; and copying data of the target memory blocks to corresponding memory blocks of the second super block, when the number of the target memory blocks is less than the set number.

BRIEF DESCRIPTION OF THE DRAWINGS

Various embodiments will now be described more fully hereinafter with reference to the accompanying drawings; however, elements and features may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, throughout the specification, reference to "an embodiment," "another embodiment," or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 11 to 13 are diagrams illustrating a second case of a refresh operation in accordance with an embodiment of the present disclosure.

DETAILED DESCRIPTION

In the following detailed description, embodiments of the present disclosure are shown and described, simply by way of example. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed. In addition, when an element is referred to as "including" a component, this indicates that the element may further include one or more other components instead of excluding such component(s), unless the context indicates otherwise.

Figure 1:
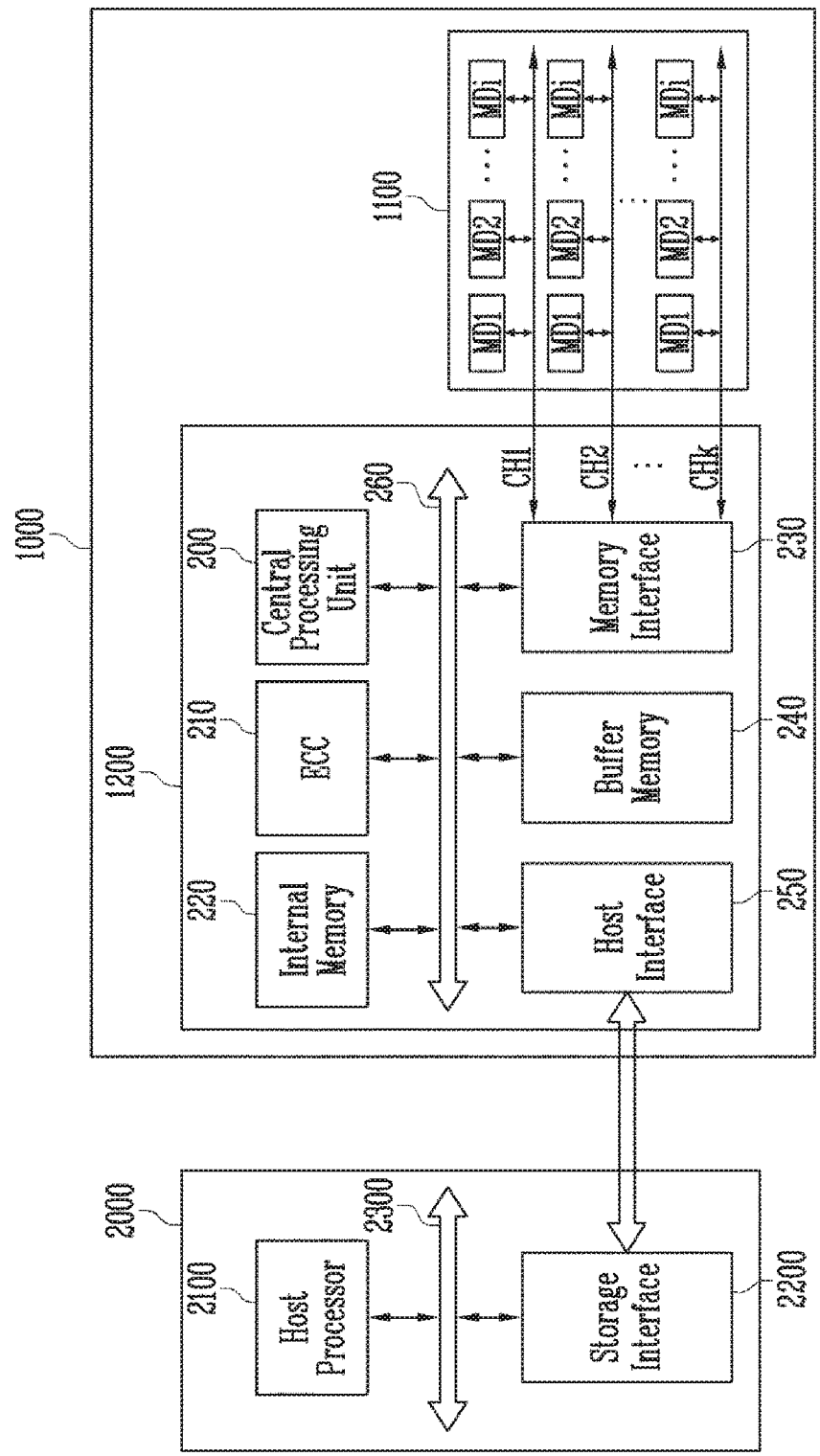
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a storage device 1100 for storing data and a memory controller 1200 for communicating between the storage device 1100 and a host 2000.

The storage device 1100 may include a plurality of memory devices MD1 to MDi (where i is a positive integer). For example, each of the memory devices MD1 to MDi is implemented with a volatile memory device in which stored data is lost when the supply of power is interrupted or a nonvolatile memory device in which store data is retained even when the supply of power is interrupted. FIG. 1 illustrates an embodiment in which the memory devices MD1 to MDi are implemented with nonvolatile memory devices. For example, the nonvolatile memory devices are flash memory devices.

The memory devices MD1 to MDi may be coupled to a plurality of channels, for example, first to kth channels CH1 to CHk. For example, the plurality of memory devices MD1 to MDi is coupled to the first to kth channels CH1 to CHk, respectively.

The memory controller 1200 may include a central processing unit (CPU) 200, an error correction code (ECC) circuit 210, an internal memory 220, a memory interface 230, a buffer memory 240, and a host interface 250.

The CPU 200 may perform various operations for controlling the storage device 1100, or generate a command and an address. The CPU 200 may monitor a read number of the memory devices MD1 to MDi included in the storage device 1100, and control a refresh operation for re-writing data of the memory devices MD1 to MDi, based on the monitoring result. For example, the CPU 200 detects a number of memory devices to be refreshed according to a read count value, and refreshes the memory devices MD1 to MDi in units of super blocks or single blocks, based on the detection result. The super block is a logical unit, and may be a unit for managing a plurality of physical memory blocks as one logical block. The single block refers to each physical memory block.

The internal memory 220 may store various information necessary for an operation of the memory controller 1200. For example, the internal memory 220 includes address map tables indicating a mapping relation between logical addresses and physical addresses. Further, the address map tables may be stored in the memory devices MD1 to MDi. When the memory system 1000 is booted, the address map tables stored in the memory devices MD1 to MDi may be re-loaded to the internal memory 220. The internal memory 220 may be implemented with at least one of a random access memory (RAM), a dynamic RAM (DRAM), a static RAM (SRAM), a cache, and a tightly coupled memory (TCM).

The memory interface 230 may exchange commands, addresses, data, and the like between the memory controller 1200 and the storage device 1100. For example, the memory interface 230 transmits commands, addresses, and data to the memory device MD1 to MDi through the first to kth channels CH1 to CHk, and receives data from the memory devices MD1 to MDi.

The buffer memory 240 may temporarily store data in a program or read operation of the memory system 1000. In the program operation, the buffer memory 240 may temporarily store original program data until a program operation of a selected memory device passes. In the read operation, the buffer memory 240 may temporarily store data read from a selected memory device and then sequentially transmit the data to the host interface 250. Also, the buffer memory 240 may store address map tables. The buffer memory 240 may be configured with a dynamic random access memory (DRAM).

The host interface 250 may exchange commands, addresses, data, and the like between the memory controller 1200 and the host 2000. For example, the host interface 250 receives a request, an address, and data from the host 2000, and transmits data to the host 2000. The CPU 200, the ECC circuit 210, the internal memory 220, the memory interface 230, the buffer memory 240, and the host interface 250 may communicate with each other through a bus 260.

The host 2000 may include a host processor 2100 and a storage interface 2200. The host processor 2100 and the storage interface 2200 may communicate with each other through a bus 2300.

The host processor 2100 may generate a program request for controlling the program operation of the memory system 1000 or a read request for controlling the read operation of the memory system 1000. In addition, the host processor 2100 may generate various operation requests such as an erase request.

The storage interface 2200 may communicate with the memory system 1000 by using an interface protocol such as a peripheral component interconnect express (PCIe), an advanced technology attachment (ATA), a serial ATA (SATA), a parallel ATA (PATA), a serial attached SCSI (SAS) or a non-volatile memory express (NVMe). The storage interface 2200 is not limited to the above-described examples, and may include various interfaces such as a universal serial bus (USB), a multi-media card (MMC), an enhanced small disk interface (ESDI), and an integrated drive electronics (IDE).

Figure 2:
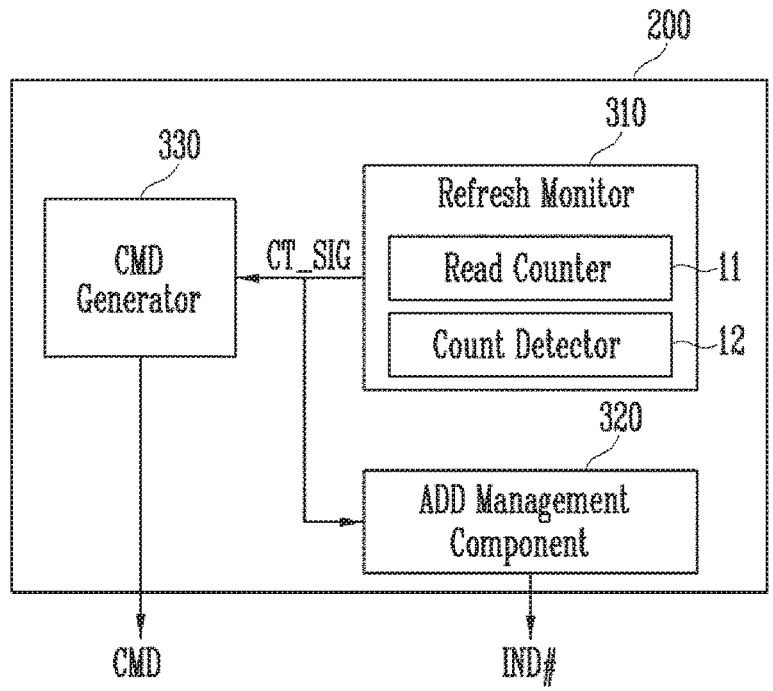
FIG. 2 is a diagram illustrating a central processing unit (CPU) in accordance with an embodiment of the present disclosure.

FIG. 2 is a diagram illustrating a central processing unit (CPU) in accordance with an embodiment of the present disclosure, for example, the CPU 200 of FIG. 1.

Referring to FIG. 2, the CPU 200 may include a refresh monitor 310, an address (ADD) management component 320, and a command (CMD) generator 330 so as to control a refresh operation of the memory devices MD1 to MDi.

The refresh monitor 310 may count a read number of each of the memory devices MD1 to MDi, and detect a number of memory devices to be refreshed based on the read numbers. To this end, the refresh monitor 310 may include a read counter 11 and a count detector 12.

The read counter 11 may count the number of read operations of each of memory blocks included in the memory devices MD1 to MDi. For example, whenever a read operation is performed in a selected memory block of a selected memory device, the read counter 11 increases a read count value of the corresponding memory block. The increased read count value may be stored in the buffer memory 240 of FIG. 1.

Also, the read counter 11 may control the buffer memory 240 to initialize a read count value of memory blocks of which refresh operation is ended.

The count detector 12 may detect the number of memory devices to be refreshed, based on the number of read operations counted by the read counter 11, and output a count signal CT_SIG by comparing the number of memory devices to be refreshed with a set number, which may be determined in advance. For example, the count detector 12 calculates the number of memory blocks to be refreshed by comparing a threshold value, which may be determined in advance, with a read count value of memory blocks. For example, the memory blocks to be refreshed may be memory blocks having a read count value greater than the threshold value. The number of memory blocks to be refreshed may be changed depending on the storage device 1100, and hence the threshold value may be changed depending on the storage device 1100. In an embodiment, the set number for determining the count signal CT_SIG may be ½ of the number of memory devices coupled to each channel. In another embodiment, the set number may be ½ of the number of memory blocks included in each super block. In still another embodiment, the set number may be ½ of the number of all memory blocks. Alternatively, the set number may gradually decrease when the cycling number of the storage device 1100 increases. The cycling number is a performed number of an erase operation and a program operation. The set number of ½ is provided by way example not limitation. The count detector 12 may determine whether the number of memory blocks to be refreshed is large or small, and output the count signal CT_SIG, based on the determination result. The reference for detecting whether the number of memory blocks to be refreshed is large or small may be differently set depending on the storage device 1100. For example, the reference is changed depending on the operation number or the cycling number of the storage device 1100.

The ADD management component 320 may output an index IND# for selecting a super block or memory block on which a refresh operation is to be performed in response to the count signal CT_SIG. For example, when the count signal CT_SIG has a logic high level, the ADD management component 320 may output an index IND# for performing the refresh operation in units of super blocks. That is, all blocks in one or more super blocks may be refreshed. When the count signal CT_SIG has a logic low level, the ADD management component 320 may output an index IND# for performing the refresh operation in units of single blocks, in which case one or more single blocks may be refreshed. Also, when data stored in a target block is copied to an arbitrary block in the refresh operation, the ADD management component 320 may re-map an address of the target block to the arbitrary block. When the data temporarily stored in the arbitrary block is copied back to the target block, the ADD management component 320 may un-map an address of the arbitrary block. Addresses with respect to indices IND# will be described in detail with reference to FIG. 6.

The CMD generator 330 may generate and output a refresh command CMD for performing the refresh operation in units of super blocks or units of single blocks in response to the count signal CT_SIG. For example, when the count signal CT_SIG has a logic high level, the CMD generator 330 may output a command CMD for performing the refresh operation in units of super blocks. When the count signal CT_SIG has a logic low level, the CMD generator 330 may output a command CMD for performing the refresh operation in units of single blocks.

Figure 3:
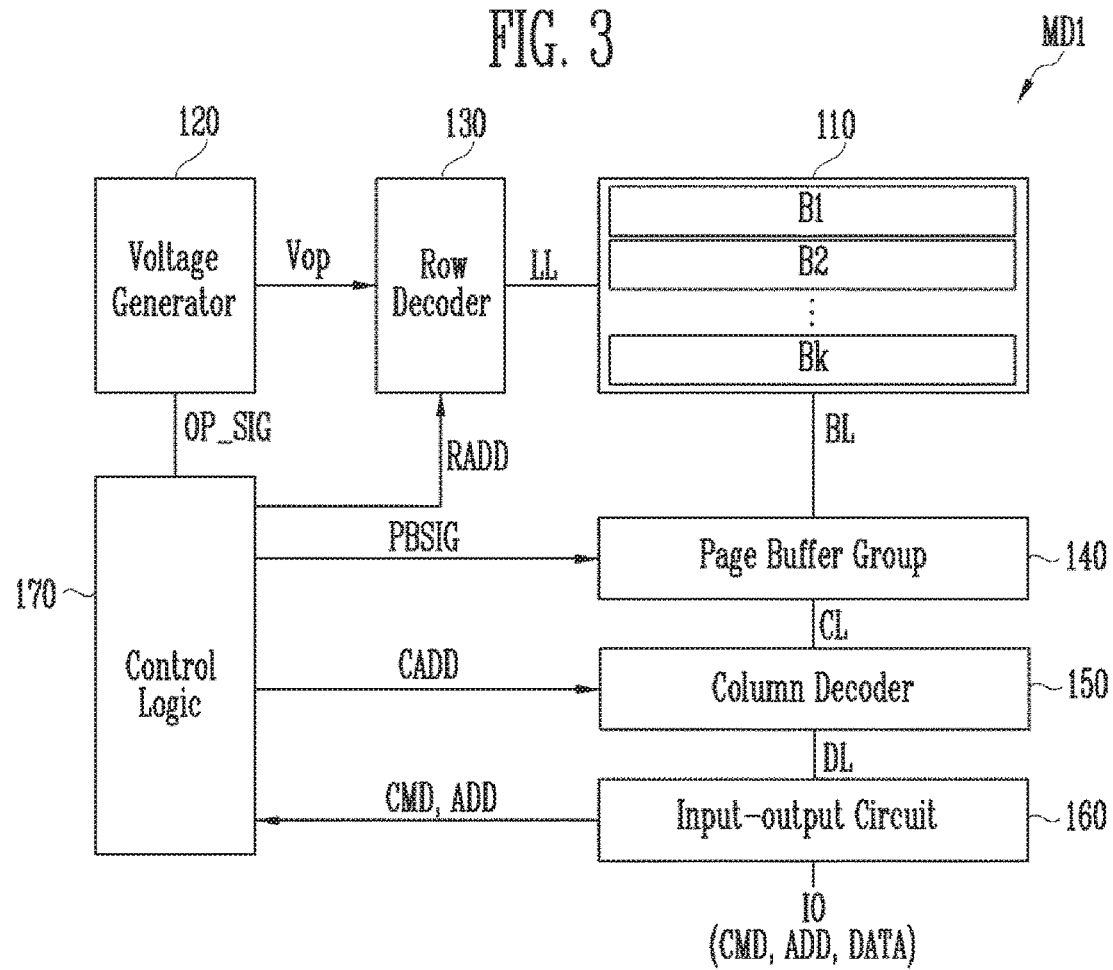
FIG. 3 is a diagram illustrating a memory device in accordance with an embodiment of the present disclosure.

FIG. 3 is a diagram illustrating a memory device in accordance with an embodiment of the present disclosure, for example, the memory device MD1 of FIG. 1.

The memory devices MD1 to MDi of FIG. 1 may be configured identically to one another. Therefore, in FIG. 3, memory device MD1, among the memory devices MD1 to MDi, will be described in detail as an example.

Referring to FIG. 3, the memory device MD1 may include a memory cell array 110 for storing data, and a voltage generator 120, a row decoder 130, a page buffer group 140, a column decoder 150, an input-output circuit 160, and control logic 170, which are configured to perform a program operation, a read operation, and an erase operation.

The memory cell array 110 may include a plurality of memory blocks B1 to Bk (where k is a positive integer). The memory blocks B1 to Bk include a plurality of memory cells, and may be implemented in a two- or three-dimensional structure. For example, in the memory blocks B1 to Bk having the two-dimensional structure, memory cells are arranged in a horizontal direction above a substrate. In the memory blocks B1 to Bk having the three-dimensional structure, memory cells are stacked in a vertical direction above a substrate.

The voltage generator 120 may generate and output operating voltages Vop necessary for each operation in response to operation signals OP_SIG. For example, when the operation signals OP_SIG are signals for a program operation, the voltage generator 120 generates a program voltage, a pass voltage, and a program verify voltage. When the operation signals OP_SIG are signals for a read operation, the voltage generator 120 may generate a read voltage, and a pass voltage. When the operation signals OP_SIG are signals for an erase operation, the voltage generator 120 may generate an erase voltage, a pass voltage, and an erase verify voltage.

The row decoder 130 may transfer the operating voltages Vop to a selected memory block of the memory cell array 110 through local lines LL in response to a row address RADD. For example, in a refresh operation, the row decoder 130 transfers the operating voltages Vop to a selected target block or an arbitrary block according to the row address RADD.

The page buffer group 140 may be coupled to the memory blocks B1 to Bk of the memory cell array 110 through bit lines BL, and include a plurality of page buffers coupled to the respective bit lines BL. The page buffer group 140 may control voltages of the bit lines BL or sense voltages or currents of the bit lines BL in response to page control signals PBSIG.

The column decoder 150 may exchange data with the page buffer group 140 or exchange data with the input-output circuit 160 in response to a column address CADD. For example, the column decoder 150 exchanges data with the page buffer group 140 through column lines CL, or exchange data with the input-output circuit 160 through data lines DL.

The input-output circuit 160 may communicate with the memory controller 1200 through input-output lines IO. For example, the input-output circuit 160 transfers a command CMD and an address ADD, which are received through the input-output lines IO, to the control logic 170, and transmits data DATA to the column decoder 150. Also, the input-output circuit 160 may output data DATA read from the memory blocks B1 to Bk to the memory controller 1200 through the input-output lines IO.

The control logic 170 may output the operation signal OP_SIG and the page control signals PBSIG in response to the command CMD, and output the row address RADD and the column address CADD in response to the address ADD. For example, when a command CMD and an address ADD, which correspond to the refresh operation, are received, the control logic 170 selects a refresh target block and an arbitrary block according to the address ADD, and control the voltage generator 120, the row decoder 130, the page buffer group 140, and the column decoder 150 such that, after data of the target block is temporarily copied to the arbitrary block, the data of the arbitrary block is copied back to the target block.

In the refresh operation, a block to be refreshed as a read count value increases may become the target block, and a block that copies data of the target block and temporarily stores the data therein may become the arbitrary block. Therefore, the memory blocks B1 to Bk may be divided into an area including target blocks and an area including arbitrary blocks. Such a configuration of the memory blocks will be described with reference to the following drawing.

Figure 4:
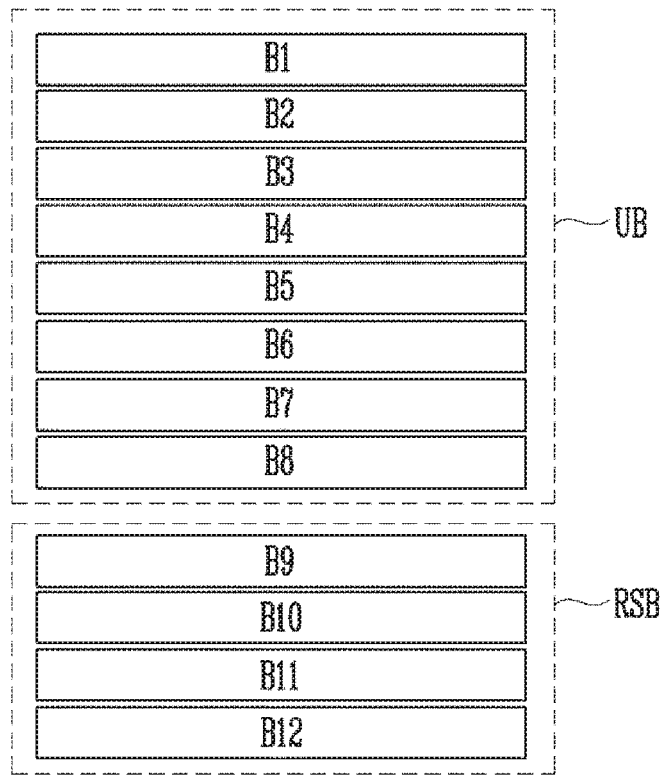
FIG. 4 is a diagram illustrating memory blocks in accordance with an embodiment of the present disclosure.

FIG. 4 is a diagram illustrating memory blocks in accordance with an embodiment of the present disclosure, for example, the memory blocks of FIG. 3. 12 memory blocks B1 to B12 will be described as an example.

Referring to FIG. 4, memory blocks B1 to B12 may include a user block UB and a reserved block RSB. Some of first to twelfth memory blocks B1 to B12 may be included in the user block UB, and some of the first to twelfth memory blocks B1 to B12 may be included in the reserved block RSB. General user data may be stored in memory blocks B1 to B8 in the user block UB. Memory blocks B9 to B12 in the reserved block RSB may be used to replace a bad block when the bad block occurs in the user block UB, or be used to temporarily store data stored in the user block UB in a refresh operation. The number of memory blocks B1 to B12 in the user block UB and the reserved block RSB may be changed depending on the memory device MD1. Alternatively, the reserved block RSB may be implemented with blocks having an erase count value less than a specific number, among all the memory blocks B1 to B12. Specifically, at the beginning, none of the memory blocks B1 to B12 is designated as part of the user block UB or the reserved block RSB. Rather, when a certain cycling number is reached, the numbers of erase operations performed on the memory blocks B1 to B12 respectively may be compared with one another. Then, memory blocks having relatively lower erase count values may be designated as the reserved block RSB, based on the comparison result.

Figure 5:
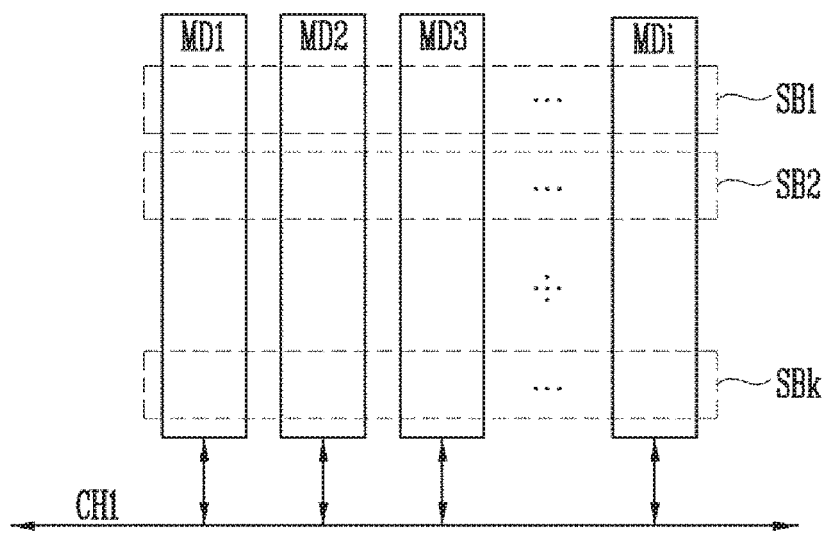
FIG. 5 is a diagram illustrating super blocks in accordance with an embodiment of the present disclosure.

FIG. 5 is a diagram illustrating super blocks in accordance with an embodiment of the present disclosure.

Referring to FIG. 5, memory blocks of first to ith memory devices MD1 to MDi coupled to the same channel CH1 may be included in a plurality of super blocks SB1 to SBk. As described above, the super block is a logical unit, and may be used to manage memory blocks physically distinguished from one another as one logical block. In general, one memory block in each of the memory devices MD1 to MDi is included in a given super block. For example, first memory blocks in the first to ith memory devices MD1 to MDi are included in a first super block SB1, and second memory blocks in the first to ith memory devices MD1 to MDi are included in a second super block SB2. In this manner, kth memory blocks in the first to ith memory devices MD1 to MDi are included in a kth super block SBk. In this embodiment, a refresh operation may be performed in the unit of super block or single block.

Figure 6:
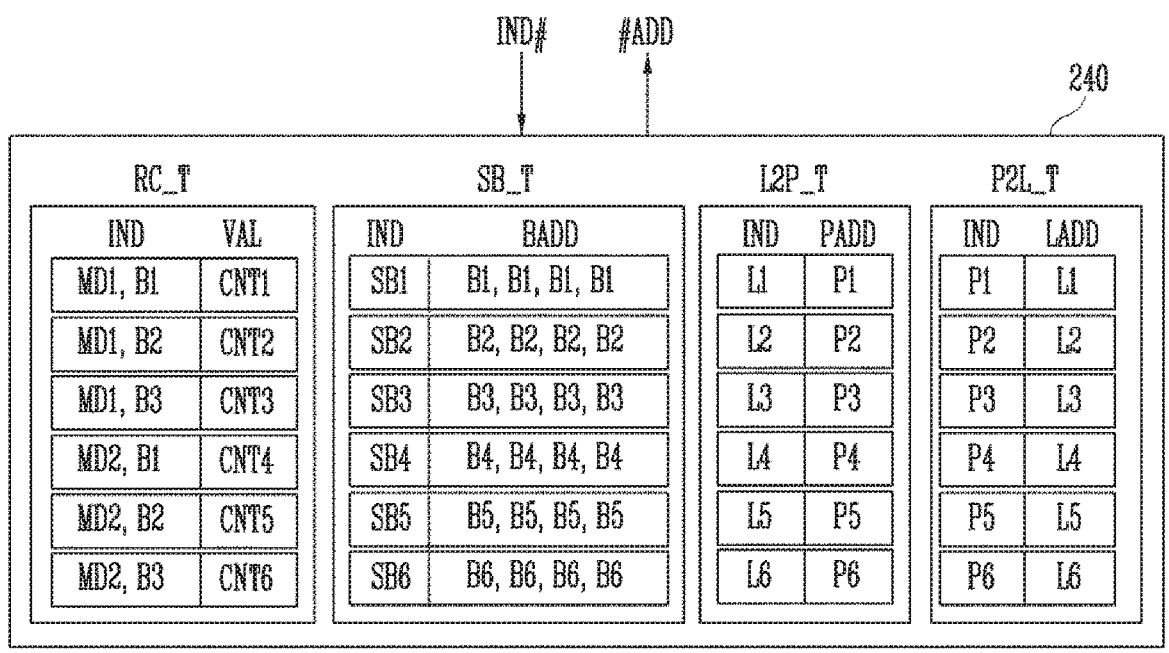
FIG. 6 is a diagram illustrating information stored in a buffer memory in accordance with an embodiment of the present disclosure.

FIG. 6 is a diagram illustrating information stored in a buffer memory in accordance with an embodiment of the present disclosure.

Referring to FIG. 6, various information related to an operation of the memory system 1000 of FIG. 1 may be stored in the buffer memory 240. Various tables may be stored in the buffer memory 240 according to kinds of information. In various embodiments, the buffer memory 240 may include a read count table RC_T, a super block table SB_T, a logical-to-physical (L2P) table L2P_T, and a physical-to-logical (P2L) table P2L_T. In addition, tables for other information may be included in the buffer memory 240.

In the read count table RC_T, a read count value of memory blocks may be stored. A memory device MD# and an address of a memory block B# may be stored in an index IND of the read count table RC_T, and a read count value CNT# may be stored in a storage value VAL of the read count table RC_T. '#' refers to a number of each information. For example, when a first index IND is an address of a first memory block B1 in a first memory device MD1, a storage value VAL corresponding to the first index IND1 may become a first read count value CNT1 of the first memory block B1. That is, in an update operation, the first read count value CNT1 may be updated when the storage value VAL corresponding to the first index IND1 is input, and be output when the first index IND1 is output. In this manner, a memory device of which read operation is performed and read count values CNT1 to CNT6 of memory blocks in the memory device may be updated. Also, in a refresh operation, the read count table RC_T may output a storage value VAL corresponding to an index IND# received from the CPU 200.

In the super block table SB_T, block addresses BADD of memory blocks in super blocks may be stored. Addresses SB1 to SB6 of super blocks may be stored in an index IND of the super block table SB_T. Physical addresses B1 to B6 of memory blocks included in each super block may be stored in a field for the block address BADD of the super block table SB_T. For example, when first memory blocks B1 are included in a first super block SB1, the first super block SB1 may become a first index IND1, and the first memory blocks B1 may become the block address BADD. This means that the first memory blocks B1 among the memory blocks in the memory devices are included in the first super block SB1. Unlike FIG. 6, assuming that physical addresses of first to fourth memory blocks are stored in the first super block SB1 and a seventh memory block included in only the second memory device among the first to fourth memory blocks is included in the first super block SB1 and the first memory blocks in the other memory devices are included in the first super block SB1, the block address BADD corresponding to the first index IND1 may become 'B1, B7, B1, B1.'

In this manner, physical addresses of memory blocks included in each super block may be stored or updated.

In the L2P table L2P_T, a physical address PADD corresponding to an index IND of a logical address may be stored. For example, the logical address is an address communicated between the host 2000 of FIG. 1 and the memory controller 1200, and the physical address may be an address communicated between the memory controller 1200 and the memory devices 1100. Therefore, the memory controller 1200 may match logical and physical addresses to each other and manage the matched logical and physical addresses as the L2P table L2P_T. For example, in the refresh operation, when data of a target block is copied to a reserved block, a physical address corresponding to the existing logical address may be updated to the reserved block. As described above, a case where mapping is changed to an address of the memory block to which the data is copied may be referred to as re-mapping.

In the P2L table P2L_T, a logical address LADD corresponding to an index IND of a physical address may be stored. In this embodiment, when the data copied to the reserved block is copied back to the target block in the refresh operation, the re-mapped address is changed to an address before the re-mapping. This may be referred to as un-map.

In the refresh operation, the read count table RC_T of the buffer memory 240 may output, to the CPU 200, a count value CNT# corresponding to an index IND# of a memory block in a memory device, and the memory device. In the refresh operation, the super block table SB_T may update the block address BADD to physical addresses of refreshed memory blocks when the refresh operation is performed in units of super blocks. In the refresh operation, the L2P table L2P_T may re-map a physical address corresponding to a refreshed logical address, and delete a logical address corresponding to a physical address before the existing re-mapping. Also, the L2P table L2P_T may update the re-mapped physical address in the un-map to the previous physical address before the re-mapping. In the refresh operation, the P2L table P2L_T may update the re-mapped physical address, and delete the re-mapped physical address in the un-map. Then, the P2L table P2L_T may update the re-mapped physical address to a physical address before the un-map.

Figure 7:
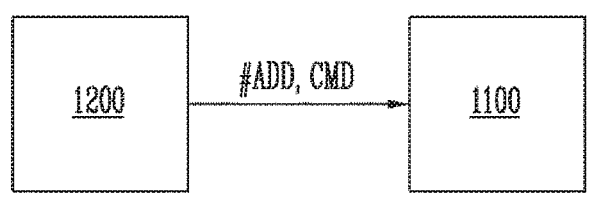
FIG. 7 is a diagram illustrating a method for controlling a memory controller and a storage device in accordance with an embodiment of the present disclosure.

FIG. 7 is a diagram illustrating a method for controlling a memory controller and a storage device in accordance with an embodiment of the present disclosure, for example, the memory controller 1200 and the storage device 1100 of FIG. 1.

Referring to FIG. 7, in a refresh operation, the memory controller 1200 may transmit, to the storage device 1100, an address #ADD of a refresh target memory block together with a command CMD. The storage device 1100 may copy data of the refresh target block to a reserved block in response to the command CMD and the address #ADD, and copy the data of the reserved block back to the target block.

Figure 8:
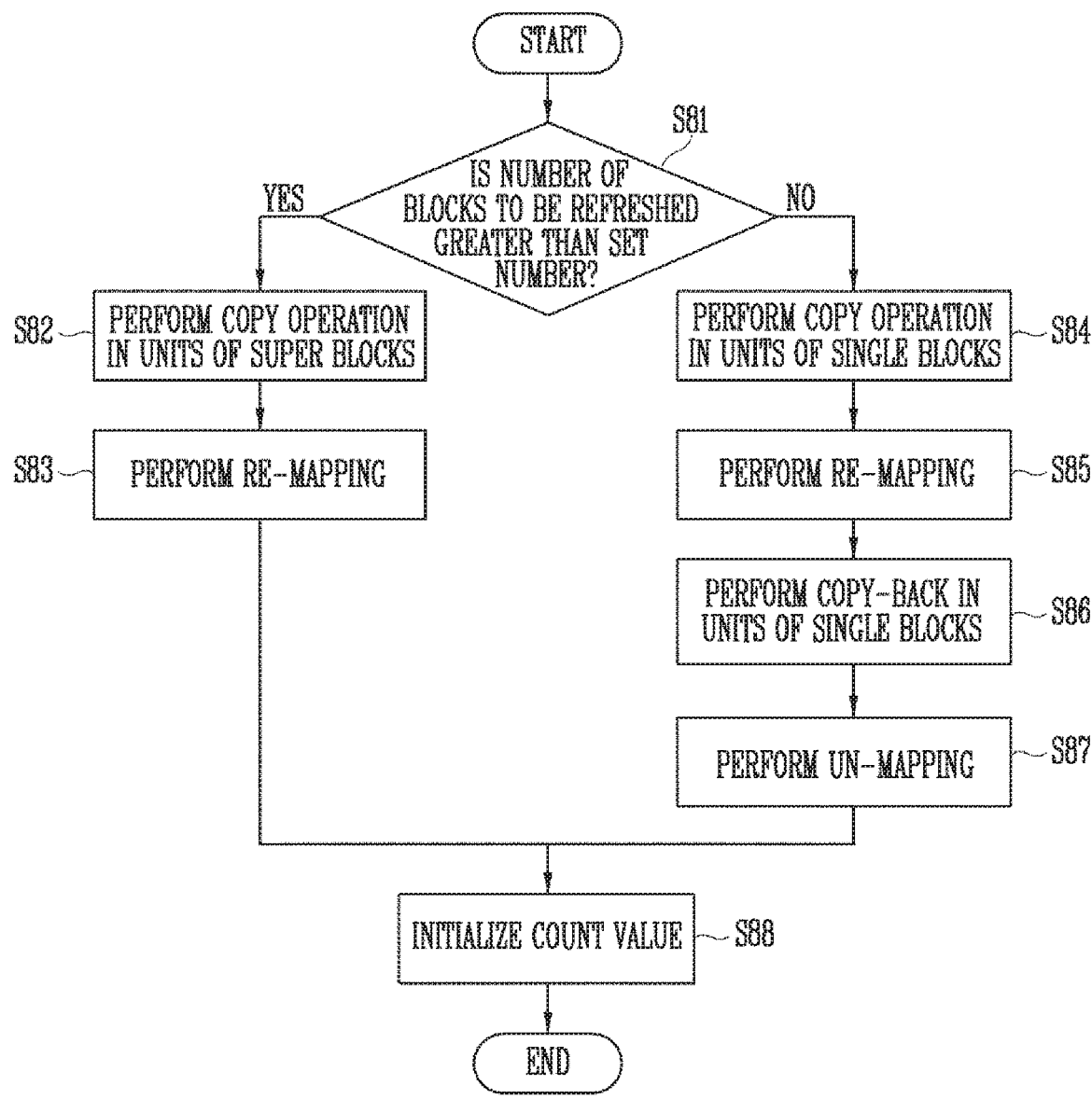
FIG. 8 is a flowchart illustrating a refresh operation in accordance with an embodiment of the present disclosure.

FIG. 8 is a flowchart illustrating a refresh operation in accordance with an embodiment of the present disclosure.

Referring to FIG. 8, when the refresh operation is started, the CPU 200 of FIG. 2 may determine whether the number of refresh target blocks is greater than a set number (S81). For example, the CPU 200 compares each of the count values CNT# stored in the read count table RC_T of FIG. 6 with a threshold value, and determines whether the count value CNT# is greater or less than the threshold value. The read count value necessary for refresh may be changed depending on the storage device 1100, and hence the threshold value may be changed accordingly.

When the number of refresh target blocks is greater than the set number (S81, Yes), a copy operation may be performed in a unit of the super block including the target blocks (S82). For example, when the number of blocks to be refreshed among memory blocks included in a super block is greater than the set number, a garbage collection operation may be performed on all the memory blocks included in the super block. At the step S82, data of all the memory blocks in the super block may be copied to another super block. For example, another super block including a large number of open blocks may be selected as a target super block, and data of the super block including the target blocks may be copied to the selected target super block. After the copy operation is completed, an erase operation of the existing blocks to be refreshed may be performed.

Although all data of the target block are copied to the target super block, logical addresses of the target blocks are maintained as they are, and therefore, physical addresses mapped to the logical addresses of the target blocks may be re-mapped to physical addresses of the target super block (S83).

When the number of refresh target blocks is less than the set number (S81, No), the copy operation may be individually performed on only the refresh target blocks (S84). For example, when the number of refresh target blocks among memory blocks in a super block is less than the set number, it is unnecessary to perform the refresh operation on blocks except the refresh target blocks, and therefore, the refresh operation may be performed on only the refresh target blocks even though other blocks are included in the super block. To this end, at step S84, the copy operation may be performed in units of single blocks. Thus, data may be copied to reserved blocks instead of the super block. After the copy operation is completed, an erase operation may be individually performed on the existing refresh target blocks.

When all data of the target blocks are copied to the reserved blocks, logical addresses mapped to the target blocks exist as they are, and therefore, physical addresses mapped to the logical addresses may be re-mapped to the reserved blocks (S85).

Subsequently, the data copied to the reserved blocks may be copied back to the memory blocks of which erase operation is performed in units of single blocks (S86).

The reserved blocks to which the data of target blocks have been copied becomes free blocks, and therefore, an un-mapping operation may be performed to remove the mapping between logical and physical addresses of the reserved blocks (S87). As described above, data of target blocks are copied to reserved blocks, and the copied data are copied back to the target blocks, so that the number of the reserved blocks may be again secured.

When the step S83 or S87 is completed, the count value CNT# of each of the refreshed target blocks may be initialized, and the refresh operation may be ended (S88).

As described above, in a refresh operation, data copied to reserved blocks are copied back to target blocks, thereby maintaining the reserved blocks as free blocks. Thus, a subsequent refresh operation may be rapidly performed in the same memory device. Further, when a bad block occurs in a user block, the bad block may be rapidly replaced with a super block or reserved blocks. That is, when the number of super blocks or reserved blocks is secured, the management of blocks in which bad block occur may be immediately performed. Thus, the operation speed of the memory system may be increased, and the reliability of the memory system may be improved.

As described above, the refresh operation is performed in units of one or more super blocks (first case) or in units of one or more single blocks (second case). Each case is described in more detail below.

Figure 9:
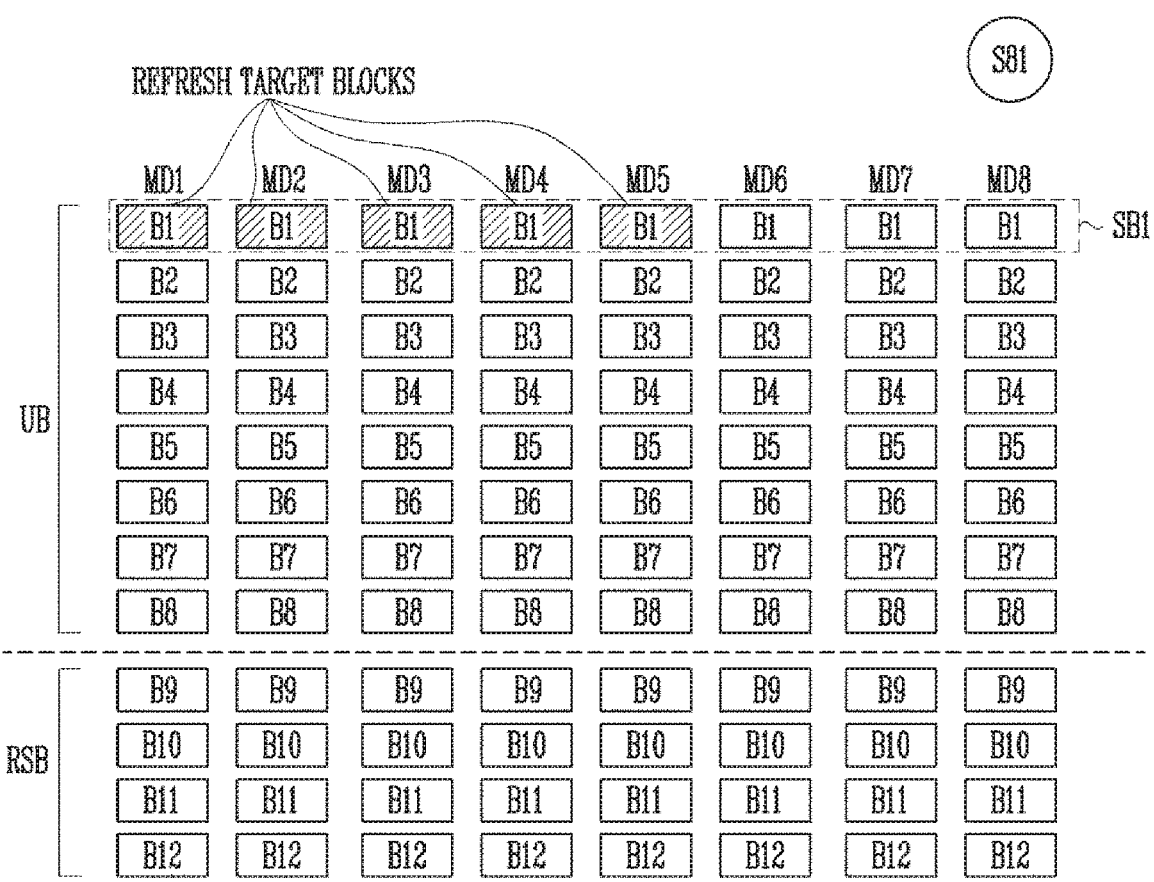
FIGS. 9 and 10 are diagrams illustrating a first case of a refresh operation in accordance with an embodiment of the present disclosure.
Figure 10:
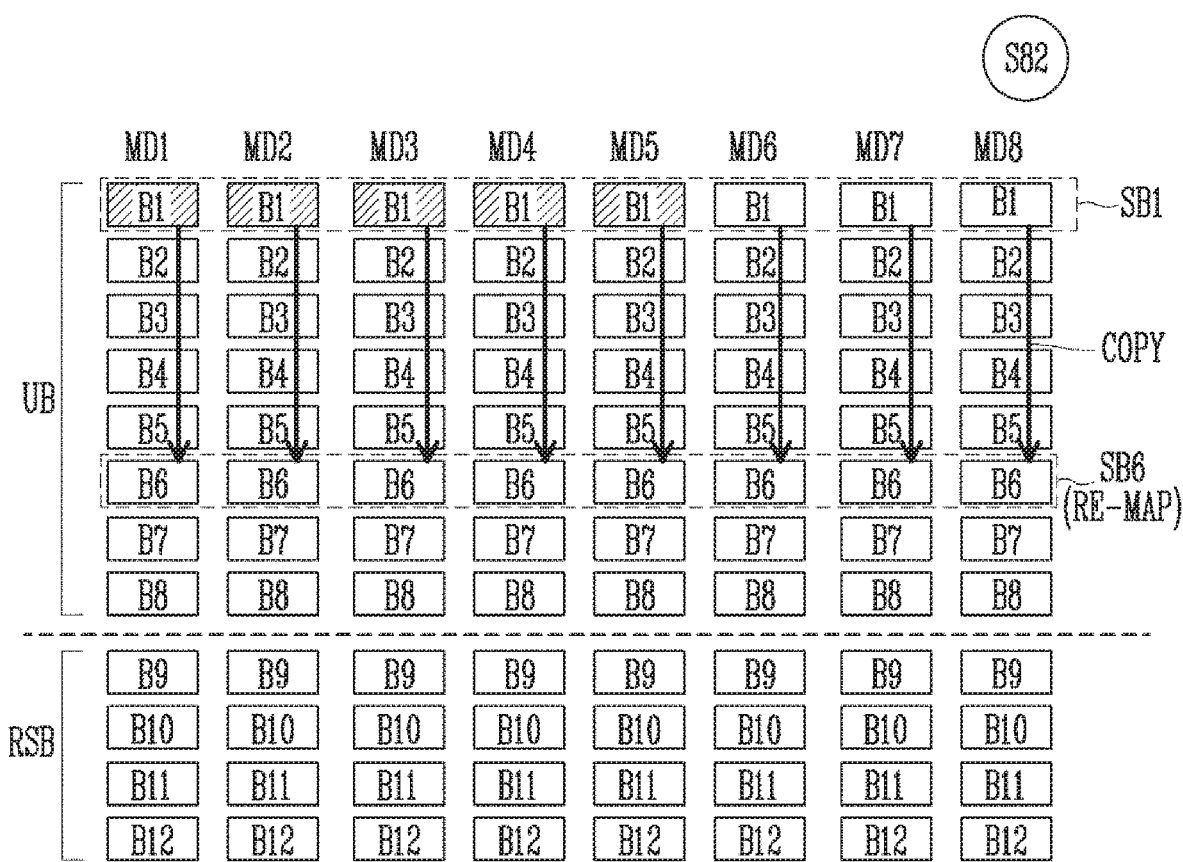
Figure 11:
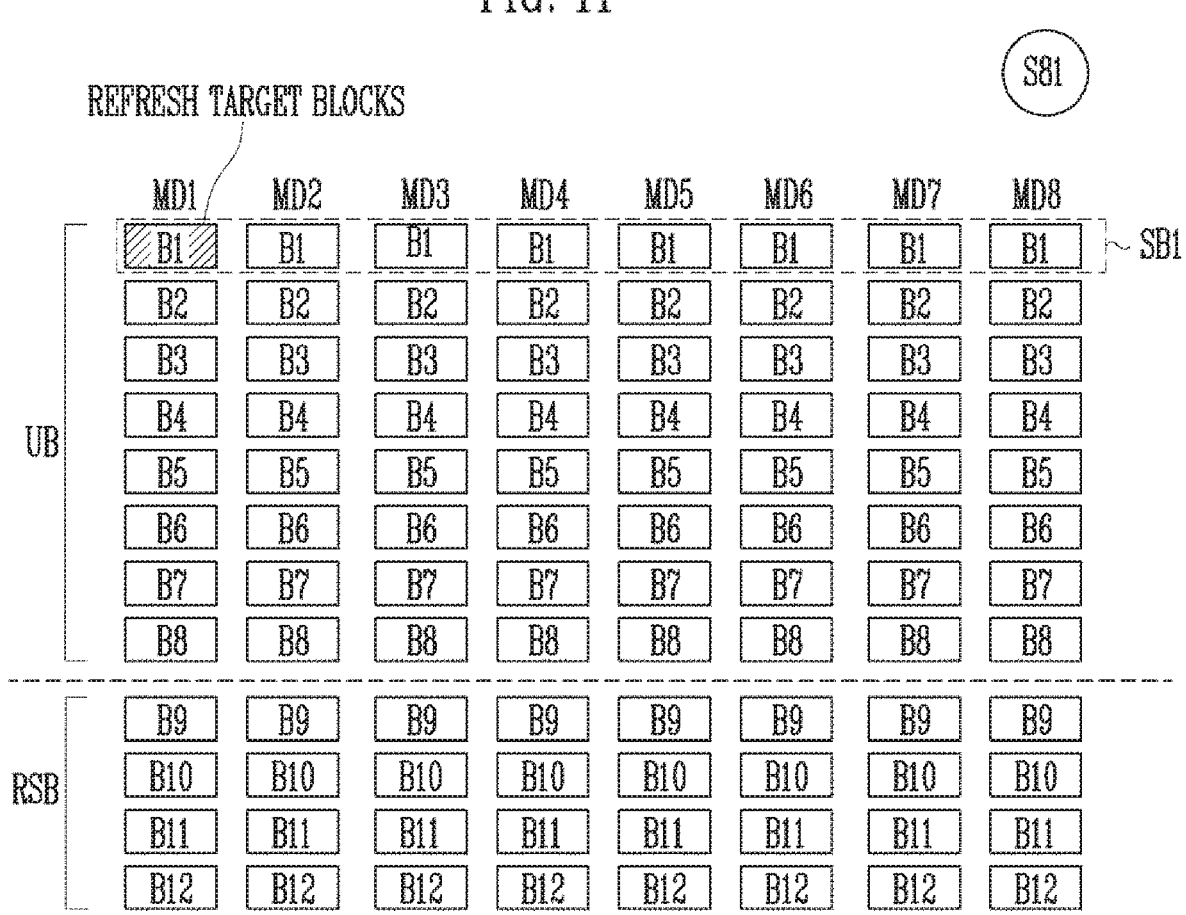
Figure 12:
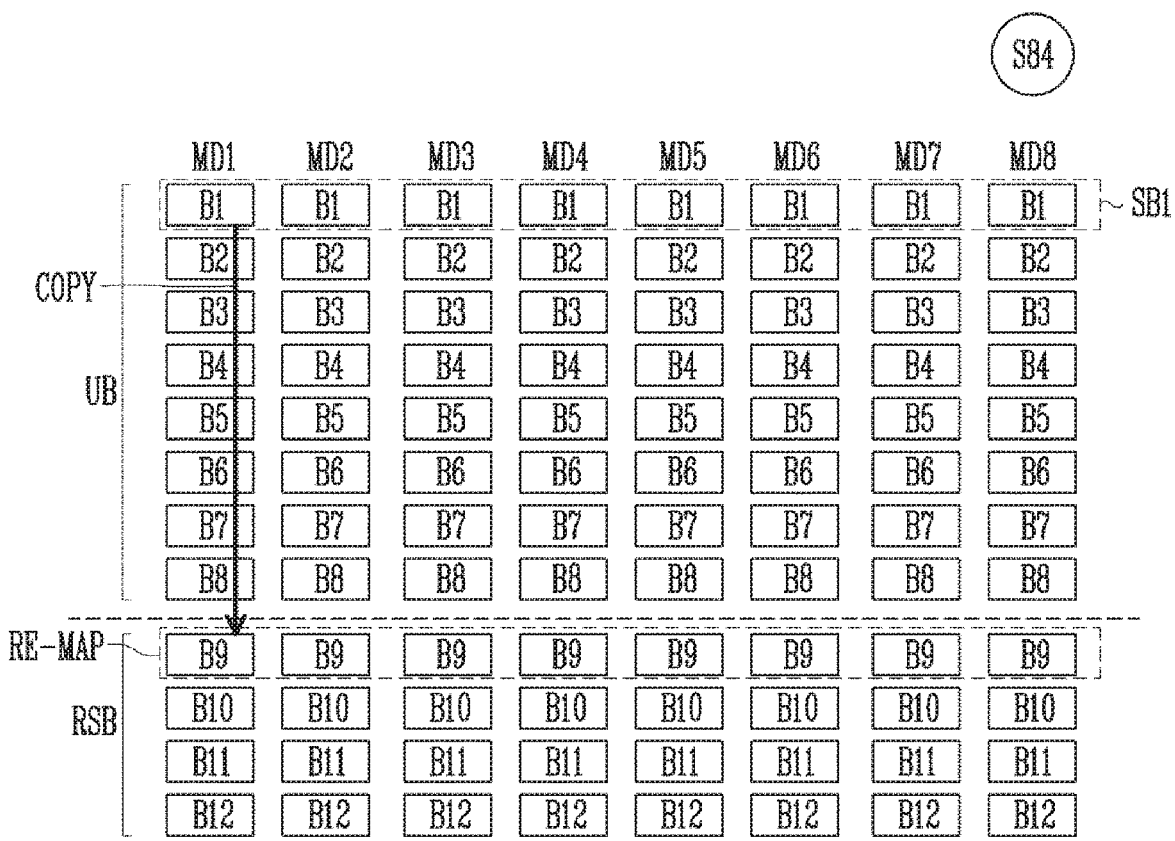
Figure 13:
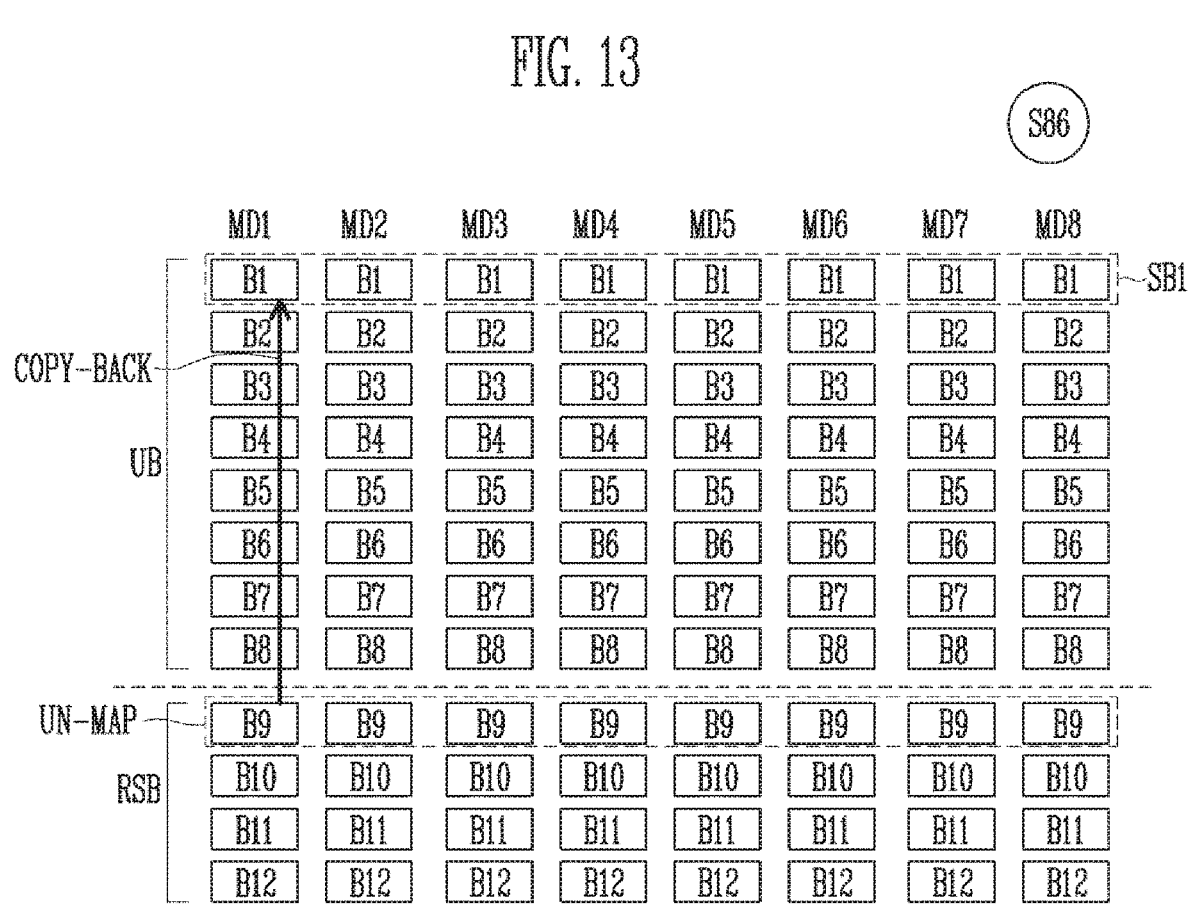

FIGS. 9 and 10 are diagrams illustrating the first case (corresponding to S81 to S83 of FIG. 8) of the refresh operation in accordance with an embodiment of the present disclosure. FIGS. 11 to 13 are diagrams illustrating the second case (corresponding to S84 to S87 of FIG. 8) of the refresh operation in accordance with an embodiment of the present disclosure.

In FIGS. 9 to 13, it is assumed that first memory blocks B1 of first to eighth memory devices MD1 to MD8 are included in a first super block SB1, and that the set number, as a reference to determine whether the refresh operation is performed in units of super blocks or single blocks, is 4. In addition, it is assumed that each of the first to eighth memory devices MD1 to MD8 includes first to twelfth memory blocks B1 to B12, the first to eighth memory blocks B1 to B8 are included in a user block UB and are managed as a super block, and the ninth to twelfth memory blocks B9 to B12 are included in a reserved block to be individually used.

Referring to FIG. 9, when the number of refresh target blocks in the first super block SB1 (i.e., 5) is greater than the set number (i.e., 4) (Yes of S81 in FIG. 8), the memory controller 1200 may control the storage device 1100 such that the refresh operation is performed in units of super blocks. For example, a case where the first memory blocks B1 included in the first to fifth memory devices MD1 to MD5, among the first memory blocks B1 in the first super block SB1, are refresh target blocks is described as follows.

Referring to FIG. 10, since the number of refresh target blocks (i.e., 5) is greater than the set number (i.e., 4), a copy operation may be performed on all the first memory blocks B1 in the first super block SB1 (S82 of FIG. 8). For example, data of all the first memory blocks B1 in the first super block SB1 may be copied to another super block, e.g., a sixth super block SB6. Therefore, a physical address mapped to the first super bock SB1 may be re-mapped from the first memory block B1 to the sixth memory block B6.

The reserved block RSB is not used in the copy operation performed in units of super blocks, and therefore, copy-back and un-mapping operations for securing the reserved block RSB are not performed.

Referring to FIG. 11, when the number of refresh target blocks in the first super block SB1 (i.e., 1) is less than the set number (i.e., 4) (No of S81 in FIG. 8), the memory controller 1200 may control the storage device 1100 such that the refresh operation is performed in units of single blocks. For example, a case where the first memory block B1 included in the first memory device MD1, among the first memory blocks B1 in the first super block SB1, is a refresh target block is described as follows.

Referring to FIG. 12, since the number of refresh target blocks (i.e., 1) is less than the set number (i.e., 4), a copy operation may be performed on only the first memory block B1 of the first memory device MD1 among the first memory blocks B1 in the first super block SB1 (S84). For example, data stored in the first memory block B1 of the first memory device MD1, among the first memory blocks B1 in the first super block SB1, may be copied to the ninth memory block B9 of the first memory device MD1 among memory blocks in the reserved block RSB. Therefore, among physical addresses mapped to the first super block SB, a physical address of the first memory block B1 of the first memory device MD1 may be re-mapped to that of the ninth memory block B9 of the first memory device MD1.

Referring to FIG. 13, the data copied to the ninth memory block B9 of the first memory device MD1 may be copied back to the first memory block B1 of the first memory device MD1 (S86). When the copy-back operation is completed, the re-mapped address is to be returned to the original address, and therefore, an un-mapping operation may be performed on the re-mapped address.

As shown in FIGS. 11 to 13, when the number of refresh target blocks in the super block is less than the set number, the refresh operation may be performed on memory blocks in units of single blocks.

Next, a re-mapping method and an un-mapping method in the refresh operation in accordance with embodiments of the present disclosure will be described in detail.

Figure 14:
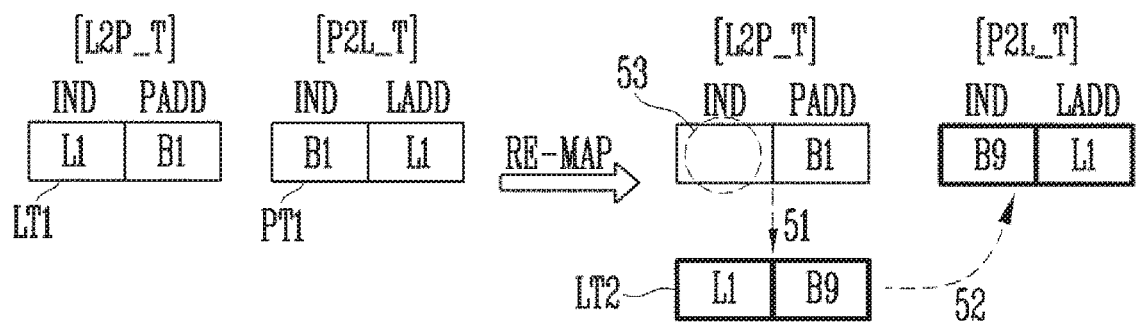
FIG. 14 is a diagram illustrating a re-mapping method in accordance with an embodiment of the present disclosure.
Figure 15:
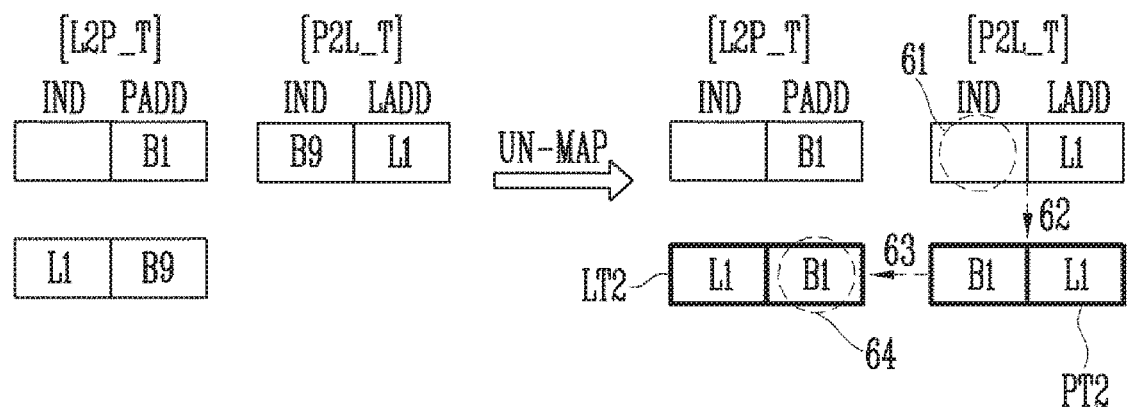
FIG. 15 is a diagram illustrating an un-mapping method in accordance with an embodiment of the present disclosure.

FIG. 14 is a diagram illustrating a re-mapping method in accordance with an embodiment of the present disclosure. FIG. 15 is a diagram illustrating an un-mapping method in accordance with an embodiment of the present disclosure.

Referring to FIG. 14, in the L2P table L2P_T before the refresh operation is performed, i.e., in a first logical table LT1, a physical address of the first memory block B1 may be mapped to a first logical address L1. This means that data corresponding to the first logical address L1 is stored in the first memory block B1. In addition, in a first physical table PT1 of the P2L table P2L_T, the first logical address L1 may be mapped to a first physical address B1. This means that data stored in the first physical address B1 corresponds to the first logical address L1.

When data of a target block is copied to a reserved block in the refresh operation, an address of the target block may be re-mapped to that of the reserved block. For example, when data of the first memory block B1 is copied to the ninth memory block B9 that is a reserved block, a second logical table LT2 is generated in the L2P table L2P_T, and the ninth memory block B9 is mapped to the first logical address L1 in the second logical table LT2 (51).

Subsequently, an index IND of the first physical table PT1 may be updated to the ninth memory block B9 in the P2L table P2L_T (52). The same index IND corresponding to the first logical address L1 is not to exist in the first logical table LT1 of the L2P table L2P_T, and therefore, an index IND before the refresh operation may be deleted in the existing first logical table LT1 (53).

Referring to FIG. 15, when the data copied to the reserved block is copied back to the target block in the refresh operation, an un-mapping operation is performed, in which the existing mapping table is removed from the re-mapped L2P table L2P_T and P2L table P2L_T. Therefore, the copy-back and un-mapping operation may be performed only when the number of refresh target blocks is less than the set number. For example, the copy-back and un-mapping operation may be performed only in the second case ('No' in the step 'S81' of FIG. 8). The un-mapping operation may be performed as follows. An index of the re-mapped table may be removed in the first physical table PT2 of the P2L table P2L_T (61), and a second physical table PT2 having an index IND of the first memory block 31 may be generated (62). A logical address corresponding to the first memory block B1 may maintain the first logical address L1 (63). That is, although the refresh operation is performed, the logical address is not changed, and therefore, the first logical address L1 may be maintained as it is.

Subsequently, in the re-mapping operation, a physical address corresponding to the first logical address L1 is changed to the ninth memory block B9 in the L2P table L2P_T. Therefore, in the un-mapping operation, the address of the ninth memory block B9 may be re-changed to that of the first memory block B1 (64).

Thus, when the un-mapping operation is performed, information of the first logical table LT1 is stored in the second logical table LT2, and information of the first physical table PT1 is stored in the second physical table PT2.

Figure 16:
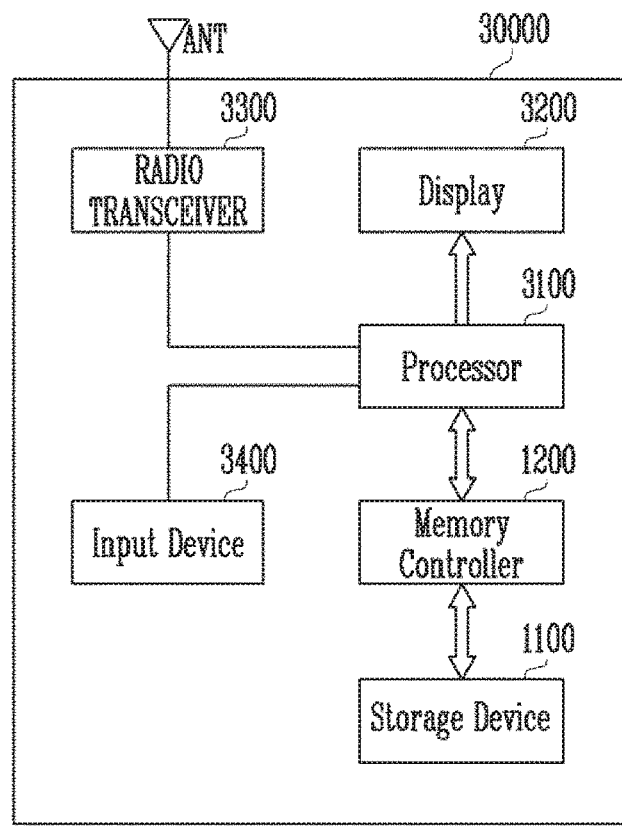
FIG. 16 is a diagram illustrating a memory system including a memory controller, such as that shown in FIG. 1, in accordance with an embodiment of the present disclosure.

FIG. 16 is a diagram illustrating a memory system 30000 including a memory controller in accordance with an embodiment of the present disclosure, for example, the memory controller 1200 shown in FIG. 1.

Referring to FIG. 16, the memory system 30000 may be implemented as a cellular phone, a smart phone, a tablet personal computer (PC), a personal digital assistant (PDA), or a wireless communication device. The memory system 30000 may include a storage device 1100 and the memory controller 1200 capable of controlling an operation of the storage device 1100. The memory controller 1200 may control a data access operation of the storage device 1100, e.g., a program operation, an erase operation, a read operation, or the like under the control of a processor 3100.

Data programmed in the storage device 1100 may be output through a display 3200 under the control of the memory controller 1200.

A radio transceiver 3300 may transmit and receive radio signals through an antenna ANT. For example, the radio transceiver 3300 converts a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the storage device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the storage device 1100 may be implemented as a part of the processor 3100, or be implemented as a chip separate from the processor 3100.

Figure 17:
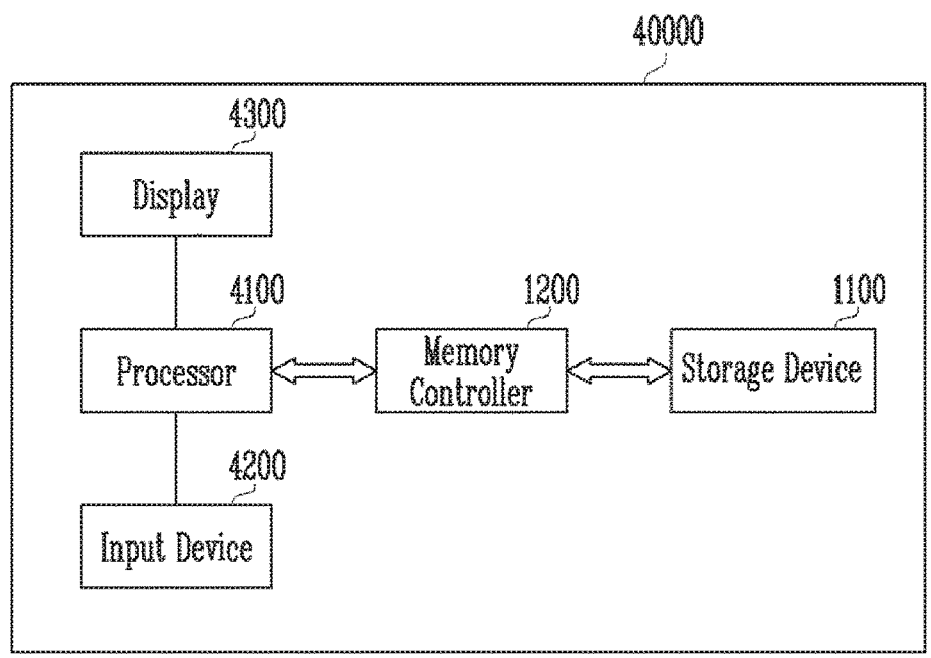
FIG. 17 is a diagram illustrating a memory system including a memory controller, such as that shown in FIG. 1, in accordance with an embodiment of the present disclosure.

FIG. 17 is a diagram illustrating a memory system 40000 including a memory controller in accordance with an embodiment of the present disclosure, for example, the memory controller 1200 shown in FIG. 1.

Referring to FIG. 17, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage device 1100 and the memory controller 1200 capable of controlling a data processing operation of the storage device 1100.

A processor 4100 may output data stored in the storage device 1100 through a display 4300 according to data input through an input device 4200. For example, the input device 4200 is implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the storage device 1100 may be implemented as a part of the processor 4100, or be implemented as a chip separate from the processor 4100.

Figure 18:
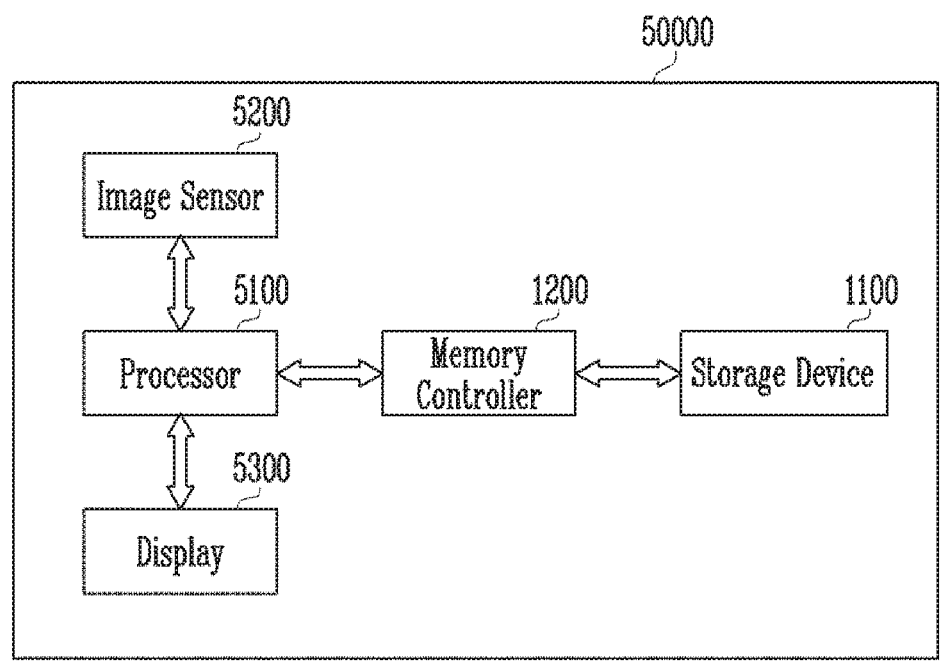
FIG. 18 is a diagram illustrating a memory system including a memory controller, such as that shown in FIG. 1, in accordance with an embodiment of the present disclosure.

FIG. 18 is a diagram illustrating a memory system 50000 including a memory controller in accordance with an embodiment of the present disclosure, for example, the memory controller 1200 shown in FIG. 1.

Referring to FIG. 18, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a storage device 1100 and the memory controller 1200 capable of controlling a data processing operation of the storage device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the storage device 1100 through the memory controller 1200. In addition, data stored in the storage device 1100 may be output through the display 5300 under the control of the processor 5100 or the memory controller 1200.

In some embodiments, the memory controller 1200 capable of controlling an operation of the storage device 1100 may be implemented as a part of the processor 5100, or be implemented as a chip separate from the processor 5100.

Figure 19:
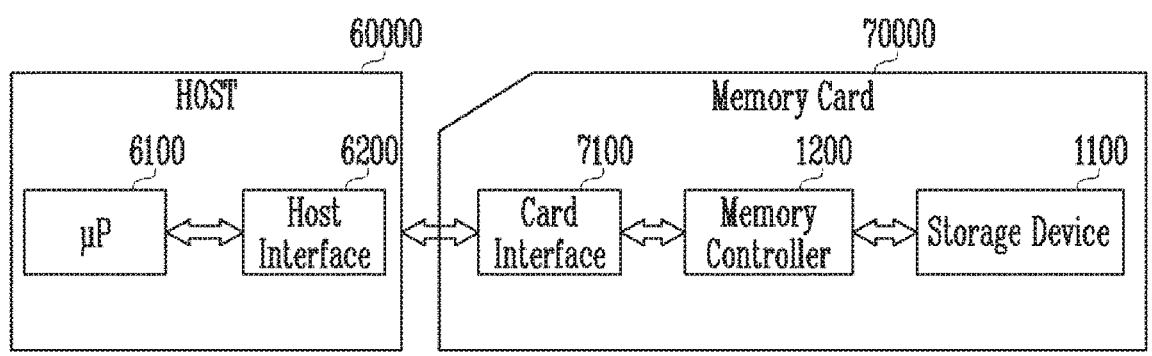
FIG. 19 is a diagram illustrating a memory system including a memory controller, such as that shown in FIG. 1, in accordance with an embodiment of the present disclosure.

FIG. 19 is a diagram illustrating a memory system 70000 including a memory controller in accordance with an embodiment of the present disclosure, for example, the memory controller shown in FIG. 1.

Referring to FIG. 19, the memory system 70000 may be implemented as a memory card or a smart card. The memory system 70000 may include a storage device 1100, the memory controller 1200, and a card interface 7100.

The memory controller 1200 may control data exchange between the storage device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the storage device 1100 through the card interface 7100 and the memory controller 1200 under the control of a microprocessor (pP) 6100.

In the memory controller and the memory system having the same in accordance with embodiments of the present disclosure, a refresh operation is selectively performed in units of super blocks or single blocks, so that the efficiency of the refresh operation can be improved.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller for controlling a storage device having a plurality of memory devices, the memory controller comprising:
   a buffer memory configured to store read count values of memory blocks included in the plurality of memory devices and address mapping information of the memory blocks; and
   a central processing unit configured to monitor the read count values, determine target blocks based on whether each of the read count values of the memory blocks is greater than a threshold value, and determine whether a refresh operation of the determined target blocks, among the memory blocks, is to be performed on all memory blocks including the target blocks in a super block in a unit of the super block, or on the target blocks in the super block in a unit of a single block, based on whether a number of the determined target blocks included in a super block is greater than a set number.

2. The memory controller of claim 1, wherein the buffer memory includes:
   a read count table configured to store and update the read count value of each of the memory blocks on which a read operation is performed;
   a super block table configured to store addresses of the memory blocks included in the super blocks;
   a logical-to-physical (L2P) table configured to store a physical address mapped to a logical address; and
   a physical-to-logical (P2L) table configured to store the logical address mapped to the physical address.

3. The memory controller of claim 1, wherein the central processing unit includes:
   a refresh monitor configured to monitor the read count values, and compare the number of target blocks with the set number, and output a count signal;
   a command generator configured to output a command for performing the refresh operation in response to the count signal; and
   an address management component configured to output an index for outputting an address from the buffer memory in response to the count signal.

4. The memory controller of claim 3, wherein the refresh monitor includes:
   a read counter configured to count a number of read operations performed in the respective memory blocks in memory devices, and store the corresponding read count values in the buffer memory; and
   a count detector configured to calculate the number of target blocks to be refreshed by comparing each of the read count values with the threshold value, compare the number of the target blocks with the set number, and output a count signal.

5. The memory controller of claim 4, wherein the threshold value and the set number depend on the memory devices.

6. The memory controller of claim 4, wherein the read counter:
   sorts, as the target blocks, blocks of which the read count value is greater than the threshold value; and
   initializes the read count value of each of the target blocks on which the refresh operation has been completed.

7. The memory controller of claim 6, wherein the read counter controls the buffer memory to initialize the read count values of the target blocks on which the refresh operation has been completed.

8. The memory controller of claim 4, wherein the command generator:
   when it is determined that the number of the target blocks is greater than the set number according to the count signal, outputs a command for performing the refresh operation on the memory blocks in the unit of the super block; and
   when it is determined that the number of the target blocks is less than the set number according to the count signal, outputs a command for performing the refresh operation on the memory blocks in the unit of the single block.

9. The memory controller of claim 4, wherein the address management component:
   when it is determined that the number of the target blocks is greater than the set number according to the count signal, outputs an index for performing the refresh operation on the memory blocks in the unit of the super block; and
   when it is determined that the number of the target blocks is less than the set number according to the count signal, outputs an index for performing the refresh operation on the memory blocks in the unit of the single block.

10. The memory controller of claim 9, wherein the buffer memory outputs addresses of blocks on which the refresh operation is to be performed according to the index.

11. The memory controller of claim 1, wherein, when the refresh operation is performed in the unit of the super block, the central processing unit controls memory devices including memory blocks in the super block to perform the refresh operation on all the memory blocks in the super block.

12. The memory controller of claim 1, wherein, when the refresh operation is performed in units of the single blocks, the central processing unit controls memory devices including memory blocks on which the refresh operation is to be performed to perform the refresh operation on only the memory blocks.

13. The memory controller of claim 1, wherein the central processing unit controls the buffer memory to initialize the read count value of the memory blocks of which refresh operation has been completed.

14. A memory system comprising:

a plurality of memory devices including a plurality of memory blocks; and a memory controller configured to:

determine target blocks based on whether each of read count values of the plurality of memory blocks in the plurality of memory devices is greater than a threshold value, when a refresh operation is performed on target blocks, on which the refresh operation is to be performed, among the plurality of memory blocks, control the plurality of memory devices to perform the refresh operation on all memory blocks in a super block including the target blocks in a unit of the super block, or on an individual block basis in the super block in a unit of a single block, according to whether a number of target blocks in the super block is greater than a set number.

15. The memory system of claim 14, wherein each of the memory blocks in each of the memory devices is in a user block or a reserved block.

16. The memory system of claim 15, wherein the memory blocks on which the refresh operation is to be perform are blocks in the user block, and the memory blocks in the reserved block are used to temporarily store data of memory blocks included in the user block in the refresh operation.

17. The memory system of claim 14, wherein the memory controller includes:

a buffer memory configured to store the read count values of the memory blocks and address mapping information of the memory blocks; and a central processing unit configured to monitor the read count values, and determine whether the refresh operation of the target blocks, among the plurality of memory blocks, is to be performed in the unit of super block or in the unit of the single block, based on the monitoring result.

18. The memory system of claim 17, wherein the buffer memory includes:

a read count table configured to store and update the read count value of each of the memory blocks on which a read operation is performed;

a super block table configured to store addresses of the memory blocks included in the super blocks;

a logical-to-physical (L2P) table configured to store a physical address mapped to a logical address; and a physical-to-logical (P2L) table configured to store the logical address mapped to the physical address.

19. The memory system of claim 17, wherein the central processing unit includes:

a refresh monitor configured to monitor the read count values, and compare the number of target blocks with the set number, and output a count signal;

a command generator configured to output a command for performing the refresh operation in response to the count signal; and an address management component configured to output an index for outputting an address from the buffer memory in response to the count signal.

20. The memory system of claim 19, wherein the refresh monitor includes:

a read counter configured to count a number of read operations performed in the respective memory blocks in the memory devices, and store the corresponding read count values in the buffer memory; and a count detector configured to calculate the number of target blocks to be refreshed by comparing each of the read count values with the threshold value, compare the number of target blocks with the set number, and output the count signal.

* * * * *